United States Patent
Liu et al.

(12)

(10) Patent No.: US 6,271,088 B1
(45) Date of Patent: Aug. 7, 2001

(54) METHOD FOR FABRICATING A BURIED VERTICAL SPLIT GATE MEMORY DEVICE WITH HIGH COUPLING RATIO

(75) Inventors: Chih-Cheng Liu, Pan-Chiao; De-Yuan Wu, Hsin-Chu, both of (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/754,350

(22) Filed: Jan. 5, 2001

(51) Int. Cl.[7] .............................................. H01L 21/8247
(52) U.S. Cl. ........................ 438/259; 438/264; 438/266; 438/589; 438/594
(58) Field of Search ................................. 438/257–267, 438/589, 593–4

(56) References Cited

U.S. PATENT DOCUMENTS 6,008,089 * 12/1999 Hong ..................................... 438/259

6,040,210 * 3/2000 Burns, Jr. et al. .................... 438/238

* cited by examiner

Primary Examiner—Richard Booth
(74) Attorney, Agent, or Firm—Winston Hsu

(57) ABSTRACT

A method of fabricating a buried vertical split gate memory cell is disclosed. First, a first trench is created in an SOI substrate for accommodating a floating gate. A second trench, having a smaller width than that of the first trench, is then created at the bottom of the first trench for accommodating a word line/control gate. Simultaneously, a silicon sidewall step structure is produced and functions as a vertical channel of the buried vertical split gate memory cell, wherein the vertical control gate channel length ($L_{CG}$) and the floating gate channel length ($L_{FG}$) is 0.25 micrometers and about 3.5 nm, respectively.

20 Claims, 5 Drawing Sheets

METHOD FOR FABRICATING A BURIED VERTICAL SPLIT GATE MEMORY DEVICE WITH HIGH COUPLING RATIO

BACKGROUND OF THE INVENTION

1. Field of the Invention

The present invention relates to a method of fabricating a vertical split gate flash memory cell, particularly, a vertical split gate flash memory cell buried in a silicon substrate, with characteristics of high coupling ratio, high density and low programming voltage.

2. Background of the Invention

For the past decade, electrically erasable programmable read only memory (EEPROM) devices have been one of the most popular and well-developed memory devices in the semiconductor industry. The advantages of the EEPROM over a conventional ROM device are its ability to electrically write, save and erase data.

Please refer to FIG. 1 of a cross-sectional conventional split gate flash memory cell 30. As shown in FIG. 1, the conventional split gate flash memory cell 30 comprises a gate oxide layer 32, a floating gate 34, a control gate 38, a drain 42, and a source 44. The control gate 38 is a step structure whereby its lower step end controls a selective channel 31. The upper end of the step structure of the control gate 38 is formed atop the floating gate 34 with a dielectric layer 36, usually of oxide-nitride-oxide (ONO), separating the two gates 34,38.

The flash memory device 30 is programmed when hot electrons from the selective channel 31 are injected into the floating gate 14 by tunneling, via the gate oxide layer 32, according to scattering or other physical mechanisms to thereby increase the threshold voltage of the flash memory cell 30. Erasure occurs when a negative voltage is applied to the control gate 38 to expel the electrons trapped in the floating gate 34. After the electrons are expelled, the threshold voltage of the flash memory cell 30 is restored to its original condition.

Although the split gate flash memory cell solves the problem of over erasing in the conventional flash memory device, the coupling ratio of the split gate flash memory cell is insufficient, leading to a reduced erasing speed or incomplete erasure. Moreover, high-speed, compact, and energy-efficient electronic devices are continually demanded by customers. To satisfy such demands, many types of high-speed/density flash memory devices have been disclosed. For example, a planar step-structure split gate flash memory cell has been developed which involves the use of both an ultra short channel and a ballistic channel hot electrons (CHE) mechanism with the advantages of low program voltage and low energy consumption.

Please refer to FIG. 2 of a cross-section of a conventional step-structure split gate device 50. As shown in FIG.2, the step-structure split gate device 50 comprises a control gate 58 and a floating gate 54 located on a silicon substrate 60. The floating gate 54 is located on a step structure, and includes a horizontal channel of 25 nm in length and a vertical channel of 25 nm in depth. A gate oxide layer 52 of 9 nm thick is positioned between the control gate 58 and the silicon substrate 60, as well as between the floating gate 54 and the silicon substrate 60. An N$^+$source region 64 is formed adjacent to the control gate 58 on the surface of the silicon substrate 60, and an N$^+$drain region 62 is located adjacent to the floating gate 54 on the surface of the silicon substrate 60. An N-type extended region 63 is located beneath the floating gate 54 adjacent to the N$^+$drain region 62, and a P-type doped area 65 is formed at the bend of the step structure to provide a high field region. Hot electrons 71 enter the depleted high field region at one end of the channel beneath the control gate 58, and directly travel towards the floating gate 54. During the injection of the hot electrons 71 into the floating gate 54, either the Coulomb effect or phonon scattering rarely occurs.

In U.S. Pat. No. 6,074,914, Ogura invents a method of making a sidewall split gate flash memory cell which possesses the high speed CHE programming feature, whereby a short channel of 25 to 60 nm is used. In U.S. Pat. No. 6,133,098, Ogura et al. present a method of making a high-density sidewall split gate flash memory cell, which includes the following features:

(1) use of a high density dual-bit cell;
(2) use of the ballistic CHE mechanism, to allow for a low writing current and low writing voltage; and
(3) a third level polysilicon control gate to override coupling of a word line with a floating gate.

However, the conventional photolithographic process makes difficult the manufacturing of a sidewall floating gate with an ultra short channel of 50 nm long. Therefore, a polysilicon layer is generally etched with a reactive ion etching method to form the polysilicon sidewall floating gate along the sidewall of the control gate. By the use of this method, the thickness of the base portion of the floating gate, also called the floating gate channel, is not easily regulated.

SUMMARY OF THE INVENTION

The purpose of the present invention is to provide a method of making a buried split gate flash memory device with an ultra short channel and having the characteristics of a larger coupling ratio, higher packing density and lower programming voltage.

Another purpose of the present invention is to provide a method of making a vertical split gate flash memory device to produce a controlled thickness of the floating gate as well as to obtain a lower operating voltage for the memory cell.

One other purpose of the present invention is to provide a method of making a dual-bit vertical split gate flash memory device on a SOI substrate, to achieve ultra-high density for the electronic device.

In the present invention, the method of making a buried split gate flash memory device involves: (1) forming a cap layer on top of a silicon substrate; (2) etching the silicon substrate to form a trench containing a sidewall; (3) forming a spacer over the sidewall; (4) etching the bottom of the trench to form a second trench containing a second sidewall; (5) performing an ion implantation process to form a source in the silicon substrate; (6) forming a dielectric layer on the bottom of the second trench; (7) forming a tunneling oxide layer over the second sidewall; (8) forming a control gate layer over the first dielectric layer and filling in the second trench; (9) removing the first spacer; (10) forming a second dielectric layer on the control gate layer; (11) forming a second tunneling oxide layer on the first sidewall; (12) forming a floating gate layer on the second dielectric layer, wherein the top of the floating gate layer is slightly lower than that of the silicon substrate; (13) forming a third dielectric layer on the floating gate layer; (14) removing the cap layer; and (15) forming a drain to replace the cap layer.

In the present invention, a CVD process is used to form both the control gate and the floating gate of the split gate flash memory device, whereby a desired floating gate channel length is effectively produced. For instance, a floating gate channel length three to four times greater than the electron mean free path can be achieved.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
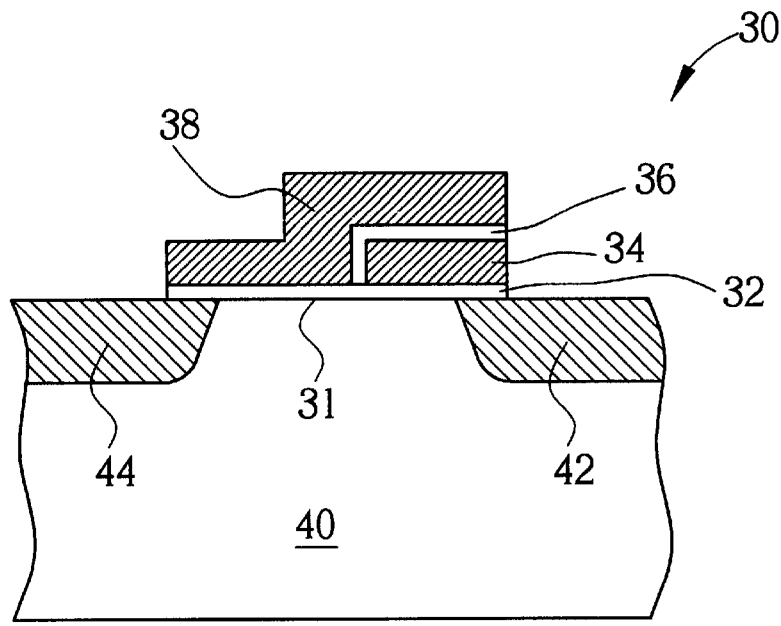
FIG. 1 is a cross-sectional diagram of a conventional split-gate flash memory cell.
Figure 2:
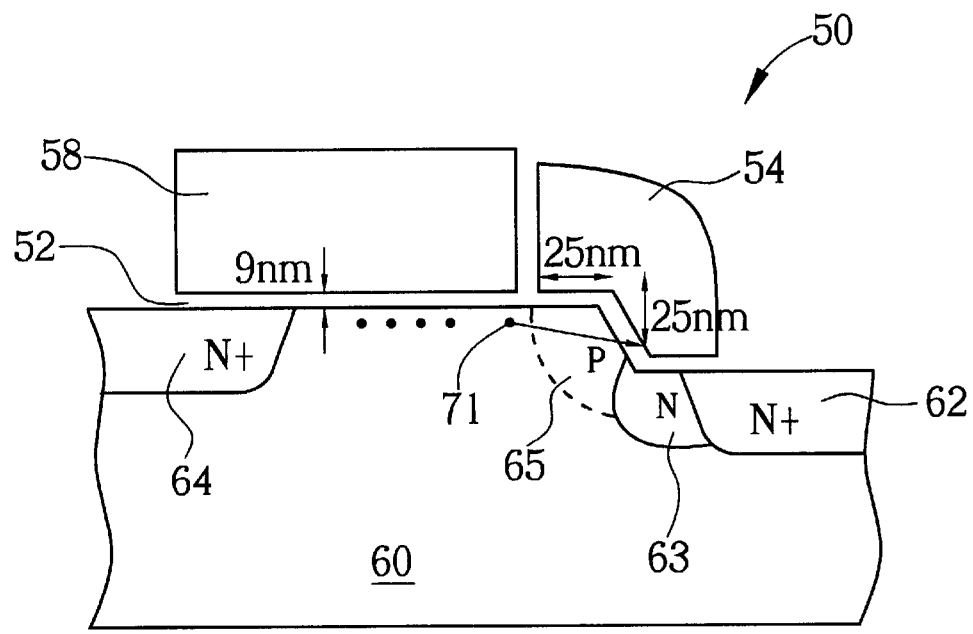
FIG. 2 is a cross-sectional diagram of a conventional step-structure split gate device.
Figure 3A:
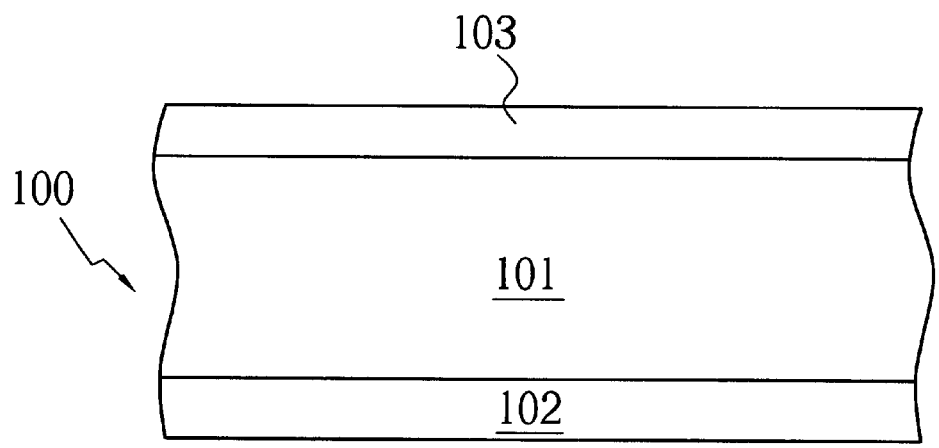
FIGS. 3A to 3H are the cross-sectional views of the method of fabricating a split-gate flash memory cell.

Please refer to FIGS. 3A to 3H of the cross-sectional views of the method of making a split gate flash memory cell 200 on a SOI substrate 100 according to the present invention. As shown in FIG. 3A, the SOI substrate 100 is an industrial product made via the well-known SIMOX method, and comprises a P-type semiconductor layer 101 of about 0.5 to 1 micrometers thick and an insulating layer 102. Other portions of the SOI substrate 100 are not explicitly shown in FIGS. 3A to 3F for illustrational purposes. The fabrication of the SOI substrate 100 is not the primary concern of the present invention, and thus will not be discussed further. The present invention first involves the use of a low-pressure chemical vapor deposition (LPCVD) process, to form an even cap layer 103 of about 2000 angstroms thick over the surface of the SOI substrate 100. The cap layer 103 functions as a protective etching mask for subsequent etching processes.

Figure 3B:
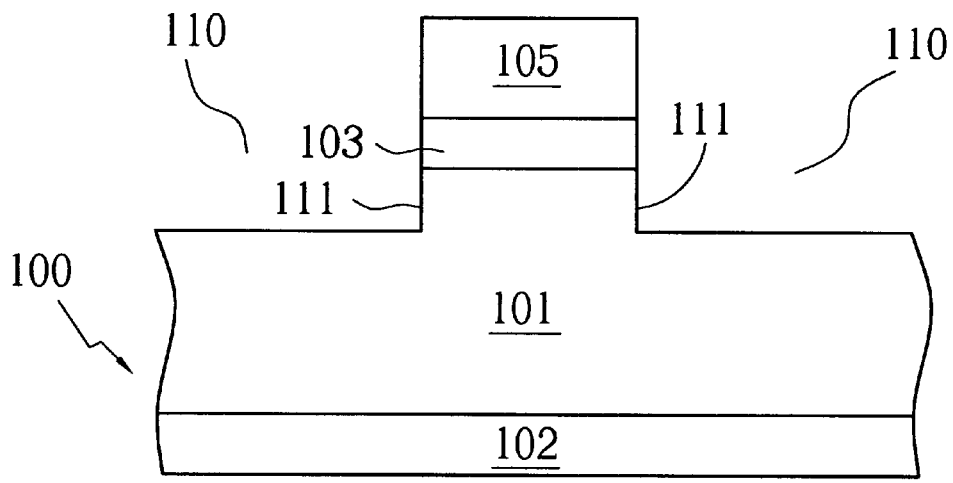

As shown in FIG. 3B, a lithographic process is performed to form a patterned photoresist 105 over the surface of the cap layer 103, followed by the use of a reactive ion etching (RIE) process to etch the portion of the substrate 101 not covered by the photoresist 105, to form trenches 110 on the surface of the semiconductor layer 101. Each trench 110 has two vertical silicon sidewalls 111. The trench 110 is used to accommodate a polysilicon floating gate to be formed in subsequent processes, with the depth of the trench 110 approximately equalling the length of a floating gate channel ($L_{FG}$). In the preferred embodiment of the present invention, the depth of the trench 110 is about 50 nm. After the formation of the trench 110, the photoresist 105 is then removed.

Figure 3C:
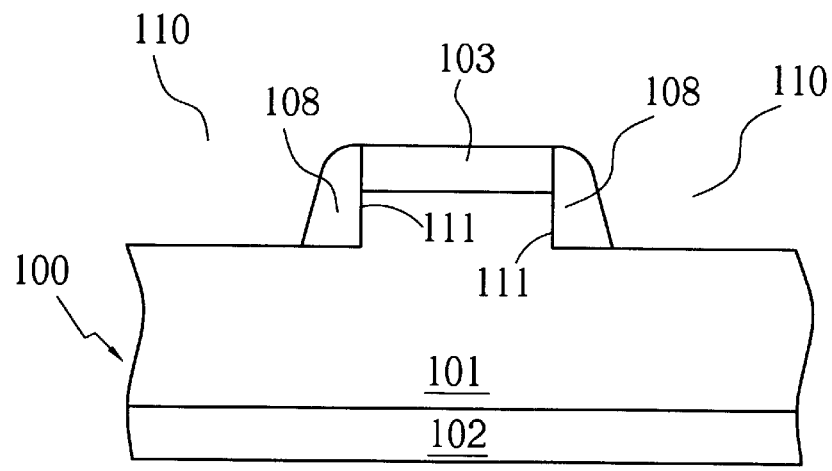

As shown in FIG.3C, after a series of cleaning and drying processes, a chemical vapor deposition (CVD) process is performed to form an even silicon dioxide layer (not shown) over the clean surface of the semiconductor layer 101, and conformally covering the trenches 110 and the cap layer 103. Then, a back etching process is performed on the silicon dioxide layer to form a spacer 108 on each vertical sidewall 111 of the trench 110, with the bottom width of the spacer 108 being about 20 to 30 nm, preferably 25 nm.

Figure 3D:
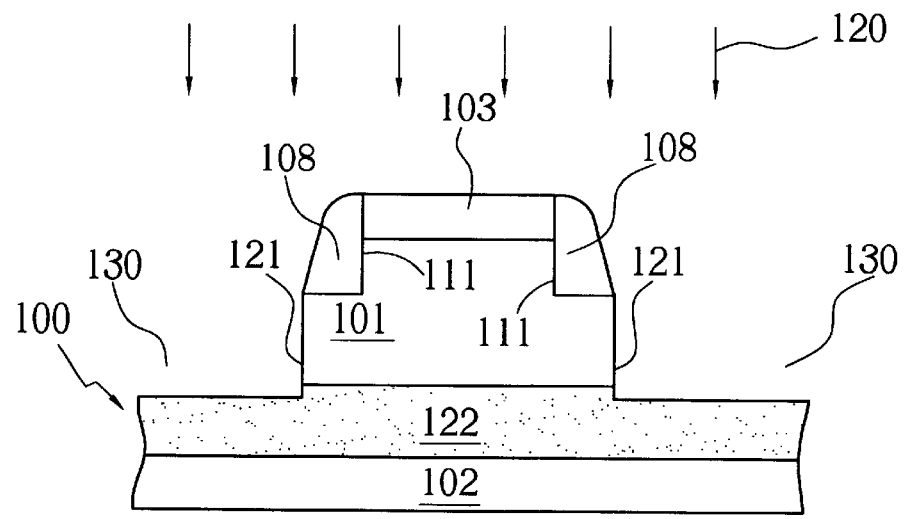

As shown in FIG.3D, a plasma-dry-etching process is performed on the semiconductor layer 101 on the bottom of the trenches 110 to form self-aligned word line trenches 130. Both the cap layer 103 and the spacer 108 are used as an etch mask during the plasma-dry-etching process. The word line trench 130 is used to accommodate a word line, and its depth in the preferred embodiment is about 0.25 to 0.4 micrometers. The word line trench 130 and the trench 110 together create a vertical silicon sidewall 121 with a length of 0.15 to 0.4 micrometers to create a step structure.

An ion implantation process 120 is then performed on the semiconductor layer 101. In the preferred embodiment, arsenic is used as a dopant and implanted into the semiconductor layer 101 in a vertical, downward direction, with a doping energy of about 30 KeV and an implant dosage of $10^{14}$ to $10^{15}$ ion/cm$^2$. A second implantation process is optionally performed to dope the semiconductor layer 101 beneath the nitride cap layer 103 with an implanting energy of about 30 KeV and a dosage of $10^{14}$ to $10^{15}$ ion/cm$^2$. As a result of the two implantation processes, a N$^+$ion doped area 122 is formed to function as a source of the memory cell in the P-type semiconductor layer 101.

However, it should be noted that the implantation energy and dosage for the implantation process of the present invention are not strictly set, but can be adjusted in order to generate a desired impurity and contour condition.

Figure 3E:
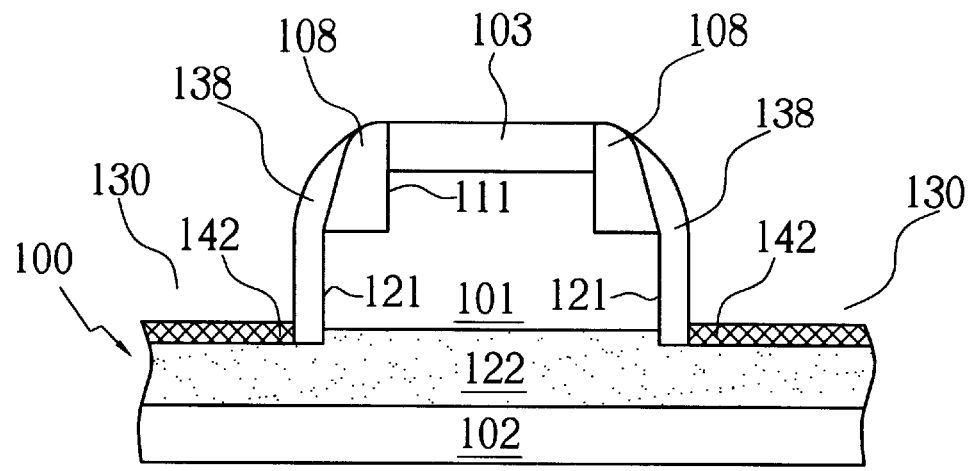

As shown in FIG.3E, a CVD process is performed to form a conformal silicon dioxide layer (not shown) over the surface of the SOI substrate 100. The silicon dioxide layer is etched back to the surface of the source 122 to form a spacer 138 on each vertical silicon sidewall 121. In a self-aligned salicide making process, the spacer 138 subsequently becomes a self-aligned salicide block with a base of 5 to 25 nanometers thick, 10 nm being optimal. Then, the surface of the SOI substrate 100 is coated with a metallic layer of a few hundred angstroms (not shown), with Co or Co/Ti being the most optimal coating material, which then becomes a salicide layer 142 following a self-aligned salicide process. The salicide layer 142 formed on the bottom of the trench 130 functions as a source line.

Figure 3F:
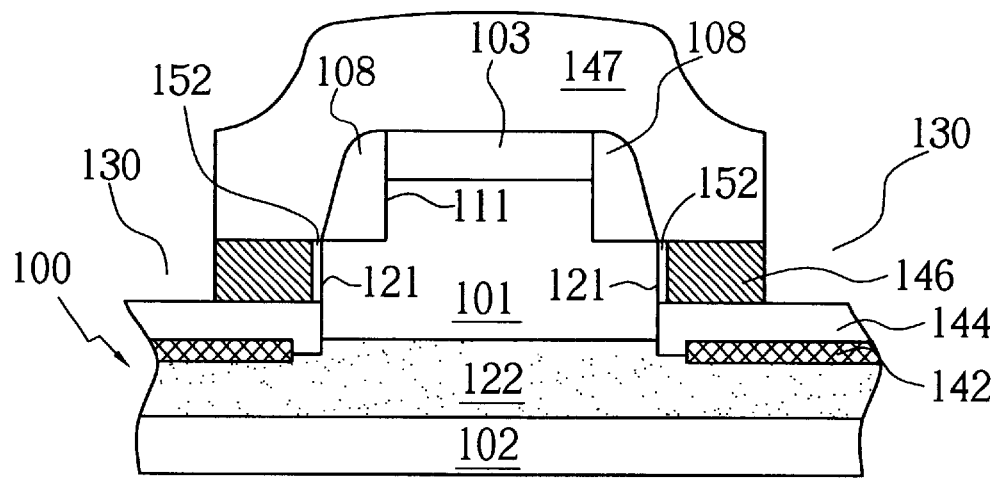

As shown in FIG.3F, a wet etching process is then performed using HF as an etchant, for example, to selectively remove the spacers 138. Thereafter, an APCVD process and a back etching process are consecutively performed to form an insulating layer 144 of a few nanometers thick, covering the salicide layer 142 on the bottom of the trench 130. A thermal oxidation method is then applied to form a control gate oxide layer 152 of 1–10 nm thick (with a recommended thickness of 9 nm) on the vertical silicon sidewall 121. The implanted impurities in the source region 122 may be activated when performing the thermal process. An in-situ doping polysilicon CVD process and then a back-etching process are both performed to form an in-situ doping polysilicon layer 146, functioning as a word line, over the insulating layer 144 and filling in the trench 130. The thickness of the polysilicon layer 146 is equal to the control gate channel length ($L_{CG}$), which is about 0.1 to 0.3 μm. Next, a patterned photoresist 147 is formed on the cap layer 103, spacers 108 and portions of the word line 146 according to a conventional lithographic process. In the preferred embodiment, the portions of the word line 146 covered by the photoresist 147 is about ¾ to ⅓ of the total surface of the word line 146. Subsequently, an a anisotropic etching process, such as a RIE process, is performed to removed the uncovered portions of the word line 146 down to the surface of the insulating layer 144. The photoresist 147 is then completely stripped by means of an oxygen plasma following the anisotropic etching.

Figure 3G:
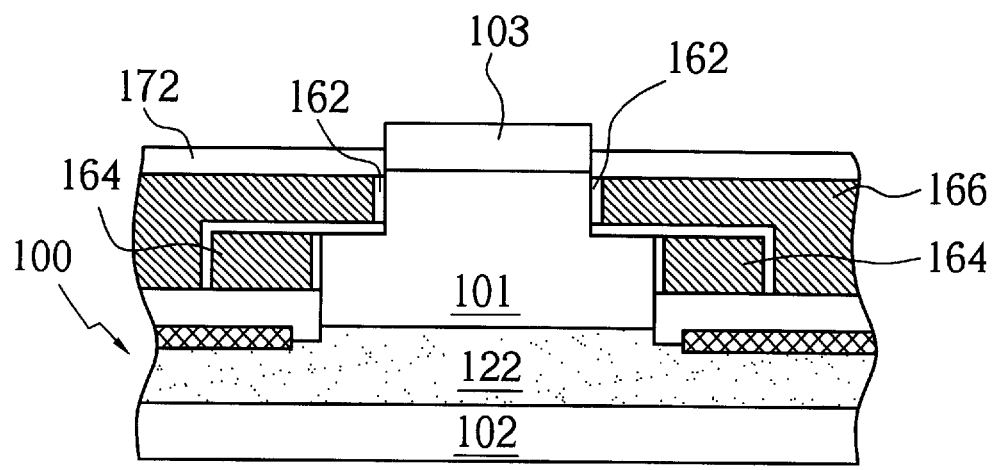

As shown in FIG.3G, a wet etching process is again performed using a HF solution, for example, to remove the spacers 108 to reveal the vertical silicon sidewalls 111. Then, an APCVD process and a back etching process are both performed, using the cap layer 103 as a protective etching mask, to form an insulating layer 164 over the polysilicon layer 146. The insulating layer 164 functions to insulate the polysilicon layer 146 from the subsequently formed floating gate. Again, a thermal oxidation process is performed to form a floating gate oxide layer 162 of 1–10 nm thick, preferably 9 nm, on each vertical sidewall 111. Next, a polysilicon CVD process and a back etching process are both performed to form a polysilicon layer 166, or a floating layer, over the insulating layer 164. The thickness of the polysilicon layer 166 is equal to the floating gate channel length ($L_{FG}$), which is about 15–50 nm, 35 nm being the most optimal. Then, the polysilicon layer 166 undergoes another lithographic process and an etching process to form the signal saving and retrieving units. A dielectric layer 172, such as a silicon dioxide layer or a PE-TEOS layer, is formed over the floating gate 166 and covering the cap layer 103. An etching back process is then performed to etch the dielectric layer 172 so as to expose the cap layer 103.

Figure 3H:
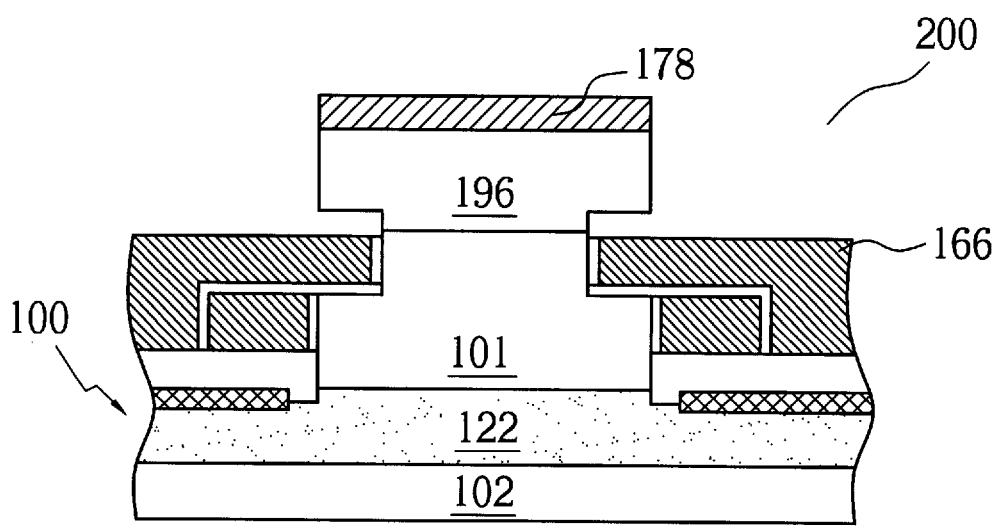

As shown in FIG.3H, the etching back process performed on the dielectric layer 172 is followed by a wet etching process using a hot phosphate solution, for instance, to selectively remove the cap layer 103 without affecting the dielectric layer 172. A bit line 196, preferably composed of in-situ doped polysilicon, is formed to replace the cap layer 103. Optionally, a self-aligned salicide process is performed on the surface of the bit line 196 to form a salicide layer 178, which functions to lower the resistance of the bit line 196. Finally, the dielectric layer 172 is removed to leave a small spacing between the floating gate 166 and the bit line 196.

The features of the vertical split gate flash memory cell 200 in the present invention are:
(1) The vertical split gate memory cell is buried in the surface of the SOI substrate 100 for increased packing density;
(2) The thickness of the floating gate 166 can be adjusted to achieve the ballistic CHE effect and thereby significantly improve program efficiency;
(3) The surface area of the memory device is greatly reduced to 4F2;
(4) The program voltage of the flash memory device 200 is lowered;
(5) The memory cell has a step structure, enabling the hot electrons to directly penetrate the insulating layer 164 and enter the floating gate 166, without inducing phonon scattering;
(6) To save and retrieve data, the channeling hot electrons need only to pass a short distance to travel through the insulating layer 164 and enter the floating gate 166; and
(7) The coupling ratio is increased.

In comparison with the prior art of making a split gate flash memory cell, the present invention uses a CVD process to produce both the control gate and floating gate of the vertical split gate flash memory cell. As well, a desirable floating gate channel length is effectively achieved by controlling the thickness of the polysilicon layer during the etching process. For example, a length of three to four times greater than the electron mean free path can be reached, so that the thickness of the tunneling layer is also reduced.

Those skilled in the art will readily observe that numerous modification and alterations of the advice may be made while retaining the teachings of the invention. Accordingly, the above disclosure should be construed as limited only by the metes and bounds of the appended claims.

What is claimed is:

1. A method for fabricating a low-voltage buried split gate flash memory cell with a high coupling ratio on a silicon substrate, the method comprising:

forming a cap layer over the surface of the silicon substrate;

masking the cap layer with a layer of patterned resist to expose a trench pattern of the cap layer;

anisotropically etching both the cap layer and the underlying silicon substrate via the trench pattern to form a first trench on the capped silicon substrate, wherein the first trench has two vertical first silicon sidewalls and a first bottom surface;

stripping the patterned resist;

forming a spacer on each of the two first silicon sidewalls of the first trench;

anisotropically etching away a depth of the first bottom surface of the first trench not covered by the spacer so as to form a self-aligned second trench at the first bottom surface of the first trench, wherein the second trench has two vertical second silicon sidewalls and a second bottom surface, and the first and second silicon sidewalls form a step structure;

implanting ions into the silicon substrate near the bottom of the second trench within a predetermined region, to form a doped region functioning as a source;

forming a source line on the bottom surface of the second trench;

forming a first dielectric layer over the bottom surface of the second trench;

thermally forming a first tunnel oxide layer on each of the two second silicon sidewalls;

forming a polysilicon layer that functions as a control gate and overlying the first dielectric layer, with the polysilicon layer filling in the second trench as well as having a top surface level with the original first bottom surface of the first trench;

performing a lithographic and etching process to etch away a portion of the polysilicon layer except near the region of the second silicon sidewall;

forming a second dielectric layer overlying the polysilicon layer;

removing the first spacers to expose the first silicon sidewalls;

thermally forming a second tunnel oxide layer on each of the two first silicon sidewalls;

forming a floating gate overlying the second dielectric layer;

forming a third dielectric layer overlying the floating gate;

removing the remaining cap layer; and forming a bit line in place of the original remaining cap layer.

2. The method of claim 1 wherein the source line is formed by the following steps:

forming a second spacer functioning as a salicide block (SAB), with a bottom thickness of approximately several nanometers, on the first spacer and each of the two second silicon sidewalls;

sputtering a metal layer on both the silicon substrate and the second spacer covering the second bottom surface of the second trench;

performing a RTP process to form the silicide layer at the second bottom surface of the second trench;

removing the unreacted metal layer; and removing the second spacer to expose each of the two second silicon sidewalls of the second trench.

3. The method of claim 1 wherein the silicon substrate is a silicon-on-insulator (SOI) substrate, and the doped region is formed above and adjacent to an insulating layer of the SOI substrate.

4. The method of claim 3 wherein the polysilicon layer has a first thickness and the floating gate has a second thickness, wherein the first and second thickness determine a control gate channel length ($L_{CG}$) and a floating gate channel length ($L_{FG}$), respectively.

5. The method of claim 3 wherein the first thickness is between 0.1 to 0.5 micrometers.

6. The method of claim 3 wherein the first thickness is approximately 0.25 micrometers.

7. The method of claim 1 wherein the second thickness equals 3× to 5× the electron mean free path.

8. The method of claim 1 wherein the second thickness is between 20 to 55 nm.

9. The method of claim 1 wherein the bit line is composed of doped polysilicon.

10. The method of claim 1 wherein the first spacer has a bottom thickness of approximately 10 to 35 nm.

11. A method for fabricating a buried vertical split gate flash memory cell having a high coupling ratio, the method comprising:

providing a silicon substrate;

forming a cap layer over the silicon substrate;

performing a first lithographic and etching process to etch the cap layer and the underlying silicon substrate so as to form a first trench, with the first trench having at least one first silicon sidewall;

forming a first spacer on the first silicon sidewall;

self-aligned etching away a depth of the bottom of the first trench using both the first spacer and the remaining cap layer as an etch mask so as to form a second trench, wherein the second trench has at least one vertical second silicon sidewall, and the first and second silicon sidewalls form a step structure;

implanting ions into the silicon substrate near the bottom of the second trench within a predetermined region, to form a doped region functioning as a source of the split gate flash memory cell;

forming a second spacer functioning as a salicide block (SAB) on the second silicon sidewall;

forming a silicide layer functioning as a source line at the bottom of the second trench;

removing the second spacer to expose the second silicon sidewall;

forming a first dielectric layer at the bottom of the second trench covering the silicide layer;

thermally forming a first tunnel oxide layer on the second silicon sidewall;

forming a polysilicon layer functioning as a control gate and overlying the first dielectric layer, with the polysilicon layer filling in the second trench and having a top surface level with the original first bottom surface of the first trench;

performing a second lithographic and etching process to etch away a portion of the polysilicon layer except near the region of the second silicon sidewall;

removing the first spacer to expose the first silicon sidewall;

forming a second dielectric layer overlying the polysilicon layer;

thermally forming a second tunnel oxide layer on the first silicon sidewall;

forming a floating gate overlying the second dielectric layer;

forming a third dielectric layer overlying the floating gate;

removing the remaining cap layer;

forming a conductive layer in place of the original remaining cap layer, functioning as a drain of the split gate memory cell; and removing the third dielectric layer.

12. The method of claim 11 wherein the silicon substrate is a silicon-on-insulator (SOI) substrate, and the doped region is formed above and adjacent to an insulating layer of the SOI substrate.

13. The method of claim 11 wherein the polysilicon layer has a first thickness and the floating gate has a second thickness, wherein the first and second thickness determine a control gate channel length ($L_{CG}$) and a floating gate channel length ($L_{FG}$), respectively.

14. The method of claim 13 wherein the first thickness is between 0.1 to 0.5 micrometers.

15. The method of claim 13 wherein the first thickness is approximately 0.25 micrometers.

16. The method of claim 13 wherein the second thickness equals 3× to 5× the electron mean free path.

17. The method of claim 13 wherein the second thickness is between 20 to 55 nm.

18. The method of claim 11 wherein the conductive layer is composed of doped polysilicon.

19. The method of claim 11 wherein the doped region is formed by performing two ion implantation processes, each having a different implant energy.

20. The method of claim 11 wherein the bottom thickness of the first spacer is approximately 10 to 35 nm.

* * * * *